June 1, 1965 O. C. STANLEY 3,187,275
SIGNAL TRACKING FILTER HAVING TUNING REACTANCE AUTOMATICALLY CONTROLLED BY VACUUM TUBE CAPACITANCE RESPONSIVE TO PHASE COMPARATOR
Filed April 5, 1963
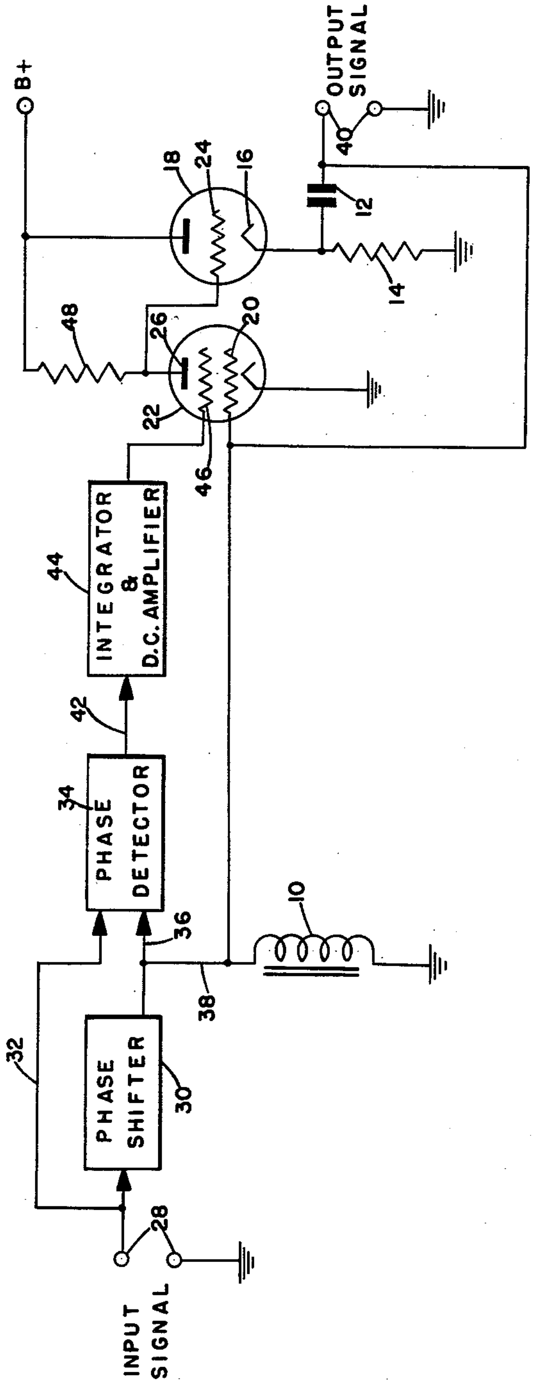
INVENTOR
OLIVER C. STANLEY
BY Knox & Knox United States Patent Office 3,187,275
Patented June 1, 1965

3,187,275
SIGNAL TRACKING FILTER HAVING TUNING REACTANCE AUTOMATICALLY CONTROLLED BY VACUUM TUBE CAPACITANCE RESPONSIVE TO PHASE COMPARATOR

Oliver C. Stanley, San Diego, Calif., assignor to The Ryan Aeronautical Co., San Diego, Calif.

Filed Apr. 5, 1963, Ser. No. 270,868
1 Claim. (Cl. 333—17)

This invention relates generally to tuned filters and particularly to filters that automatically tune to the frequency of an input signal.

*Background*

Filters of various types are well known in the art, their general purpose being selective acceptance or rejection of electrical signals. Filters are classified generally as low-pass, high-pass, or band-pass filters and usually are untuned or pretuned to operate within a fixed band of frequencies. Band-pass filters may be designed to pass either a wide band or a narrow band of frequencies. A narrow band-pass or high Q filter may be designed to pass the fundamental sine wave of a complex wave form, eliminating all harmonics of the fundamental, or to pass the average frequency of a relatively wide band signal spectrum.

A special class of band-pass filters uses automatic tuning to keep the filter tuned to the frequency of an input signal that changes in frequency, to the fundamental of a complex wave form or a desired harmonic thereof, or to the "center of power" of an input signal spectrum. Filters in this class are used in vibration and noise analyzers, underwater sound ranging devices, Doppler radar signal detection circuits, and other applications.

The instant invention is a high Q, narrow band-pass filter using novel means for varying the filter capacitance in accordance with the changing phase characteristic of an input signal whereby the filter is tuned automatically to the input frequency or average frequency of the input spectrum.

*Objects*

It is a principal object of this invention to provide an automatically tuned signal filter that passes a fundamental or average frequency and rejects all harmonics and spectrum or noise frequencies outside the filter band-pass characteristic.

It is another object of this invention to provide a signal filter the capacitance of which changes with the changing phase of an input signal whereby the filter is tuned automatically to bring the input signal in phase.

It is yet another object of this invention to use the dynamic capacitive feedback characteristic of a vacuum tube known as the Miller effect to change the capacitance of an LC filter in accordance with the changing phase of an input signal whereby the LC filter is kept resonant to the input signal.

With these and other objects definitely in view, this invention consists in the novel combination and arrangement of elements as will be hereinafter fully described in the specification, particularly pointed out in the claims, and illustrated in the drawings that form a material part of this disclosure, and in which the single figure shows a preferred embodiment of the invention.

*Detailed description*

In the figure, inductor 10 and capacitor 12 form a parallel resonant LC filter circuit that includes resistor 14. This is a high Q, narrow band-pass resonant circuit presenting a low resistive impedance within the tank circuit and a high resistive impedance to input signals at the resonant frequency, the impedance being capacitive reactive above resonance bypassing high frequency signals to ground, and inductive reactive below resonance bypassing low frequency signals to ground. At resonance, the phase of input signals is not changed since the impedance is resistive. Above resonance, however, the phase of an input signal is changed to a leading phase, while below resonance the phase becomes lagging.

Capacitor 12 is connected from cathode 16 of vacuum tube 18 to grid 20 of vacuum tube 22. Grid 24 of tube 18 is connected to anode 26 of tube 22. Consequently, it is apparent that interelectrode capacitances between cathode 16, grid 24, anode 26, and grid 20 are connected in series, and the series combination is connected in parallel with capacitor 12, increasing the static, fixed capacitance and decreasing the fundamental frequency of the LC filter circuit. It is also apparent that any change in these interelectrode capacitances will change the fundamental frequency of the LC filter circuit.

As is well known, the static and dynamic interelectrode capacitances of a vacuum tube are different, the capacitance varying with the gain of the tube. This essentially is a vacuum tube characteristic called the Miller effect, the practical result being that capacitive feedback changes with changing gain. It follows then that the capacitance of the LC filter can be changed by changing the gain of tubes 18 and 22, and the LC filter can be tuned automatically to the frequency of an input signal if the input signal is used to vary the gain of the tubes. This is the unique method of the instant invention for automatic filter tuning as described hereinafter.

An input signal applied to input terminals 28 is fed to phase shifter 30 and as a comparison signal 32 to phase detector 34. Phase shifter 30 shifts the phase of the input signal 90 degrees and feeds the shifted signal as a reference signal 36 to phase detector 34 and an output signal 38 to the common juncture of inductor 10, grid 20, capacitor 12, and output terminals 40. Phase detector 34 has no output when comparison signal 32 and reference signal 36 are exactly 90 degrees out of phase.

This is the condition existing when the LC filter circuit is resonant to the frequency of reference signal 36 and output signal 38. The impedance of the LC filter circuit then being resistive, output signal 38 is fed to output terminals 40 without change in phase. While application of output signal 38 to grid 20 of vacuum tube 22 varies the gain of tubes 18 and 22, the variation is constant at the frequency of output signal 38, and the LC filter circuit remains tuned to the output signal frequency.

When the LC filter circuit is not tuned to the frequency of reference signal 36 and output signal 38, the impedance of the circuit is capacitive or inductive, and the phase of the two signals is changed. Comparison signal 32 and reference signal 36 then are not exactly 90 degrees out of phase, and phase detector 34 has an output with polarity dependent on whether the phase relationship is leading or lagging. This output is fed as a tuning error signal 42 to integrating D.C. amplifier 44, where transient pulses are integrated and amplified to produce a smooth, tuning error voltage output. This tuning error voltage output then is applied to grid 46 of vacuum tube 22, changing the gain of the tube in a direction dependent on polarity of the tuning error voltage.

As the current in vacuum tube 22 changes, a changing voltage drop across load resistor 48 is applied to grid 24 of vacuum tube 18 changing the gain of the tube. As a result of the changing gain of tubes 18 and 22, the effective capacitance of the LC filter circuit changes until the filter is resonant to the frequency of reference signals 36 and output signal 38 and the tuning error voltage is reduced to zero. While the tuning error voltage is being applied, the average effect of output signal 38 on grid 20 of vacuum tube 22 is negligible.

After the LC filter circuit is tuned to resonance, comparison signal 32 and reference signal 36 again are exactly 90 degrees out of phase, phase detector 34 has no output, and output signal 38 is passed to output terminals 40 without change in phase. Subsequently, a small change in input signal frequency causes the LC filter circuit to tune automatically to the new frequency in the manner described.

Thus, it is apparent that the instant invention, using components known in the art but in a novel combination, provides a simple, reliable and effective method for keeping a high Q, narrow band-pass filter tuned to an input signal.

It is understood that minor variation from the form of the invention disclosed herein may be made without departure from the spirit and scope of the invention, and that the specification and drawings are to be considered as merely illustrative rather than limiting.

I claim:

In a signal tracking filter, the combination comprising:

a phase shifter for changing the phase of an input reference signal;

a phase detector connected to receive said input signal as a comparison signal and the reference signal output of said phase shifter whereby said phase detector has no output when said comparison and reference signals are 90 degrees out of phase;

an integrator-amplifier connected to receive an output from said phase detector when the relative phase of said reference and comparison signals changes from 90 degrees;

filter means connected to the output of said phase shifter for passing signals in a narrow band of the frequency spectrum and rejecting all other signals; and means for tuning said filter means to resonate at the center of said narrow band, said tuning means having a first input and an output both connected to the output of said phase shifter and a second input connected to the output of said integrator-amplifier whereby said filter means is tuned automatically to the output signal frequency of said phase shifter when said integrator-amplifier has an output.

References Cited by the Examiner

UNITED STATES PATENTS

| | | | |
|---|---|---|---|
| 2,121,736 | 6/38 | Foster | 334—16 |
| 3,069,637 | 12/62 | Seeley | 334—16 |

HERMAN KARL SAALBACH, *Primary Examiner.*